US007646032B2

United States Patent
Radkov et al.

(10) Patent No.: US 7,646,032 B2
(45) Date of Patent: Jan. 12, 2010

(54) WHITE LIGHT LED DEVICES WITH FLAT SPECTRA

(75) Inventors: Emil Vergilov Radkov, Euclid, OH (US); Anant Achyut Setlur, Niskayuna, NY (US); Ilona Elisabeth Hausmann, Elyria, OH (US); Marisa L. Goodin, legal representative, Elyria, OH (US)

(73) Assignee: Lumination LLC, Valley View, OH (US)

( * ) Notice: Subject to any disclaimer, the term of this patent is extended or adjusted under 35 U.S.C. 154(b) by 288 days.

(21) Appl. No.: 11/810,000

(22) Filed: Jun. 4, 2007

(65) Prior Publication Data

US 2007/0235751 A1    Oct. 11, 2007

Related U.S. Application Data

(63) Continuation-in-part of application No. 10/580,973, filed on Apr. 2, 2007.

(51) Int. Cl.
*H01L 33/00* (2006.01)
(52) U.S. Cl. .............................. 257/89; 257/98; 257/99; 257/100; 257/E33.061
(58) Field of Classification Search ................... 257/89, 257/98, 99, 100, E33.061
See application file for complete search history.

(56) References Cited

U.S. PATENT DOCUMENTS

| 5,803,579 | A | * | 9/1998 | Turnbull et al. ............ 362/516 |
|---|---|---|---|---|
| 6,084,250 | A | | 7/2000 | Juestel et al. |
| 6,099,754 | A | | 8/2000 | Yocom et al. |
| 6,278,135 | B1 | | 8/2001 | Srivastava et al. |
| 6,429,583 | B1 | | 8/2002 | Levinson et al. |
| 6,523,976 | B1 | * | 2/2003 | Turnbull et al. ............. 362/231 |
| 6,621,211 | B1 | | 9/2003 | Srivastava et al. |
| 6,734,467 | B2 | | 5/2004 | Schlereth et al. |
| 7,524,097 | B2 | * | 4/2009 | Turnbull et al. ............. 362/545 |
| 2003/0067008 | A1 | | 4/2003 | Srivastava et al. |
| 2003/0075705 | A1 | | 4/2003 | Wang |
| 2003/0156425 | A1 | * | 8/2003 | Turnbull et al. ............. 362/545 |
| 2004/0000862 | A1 | | 1/2004 | Setlur et al. |
| 2004/0239243 | A1 | * | 12/2004 | Roberts et al. ............. 313/512 |
| 2004/0245532 | A1 | | 12/2004 | Maeda et al. |

FOREIGN PATENT DOCUMENTS

| EP | 1 574 558 A1 | 9/2005 |
|---|---|---|
| WO | WO 01/33640 A1 | 5/2001 |
| WO | WO 03/032407 A1 | 4/2003 |

OTHER PUBLICATIONS

HunterLab, "Equivalent White Light Sources and CIE Illuminant", Applications Note: *Insight on Color*, May 2005, vol. 17, No. 5, pp. 1-5, Copyright HunterLab 2005.

* cited by examiner

*Primary Examiner*—Ngan Ngo
(74) *Attorney, Agent, or Firm*—Fay Sharpe LLP

(57) ABSTRACT

A light emitting apparatus including a phosphor blend including two or more phosphors to provide an emission spectrum simulating the spectral power distribution of a CIE reference illuminant across at least a certain spectral range. Such an apparatus is particularly suited for color-critical applications.

16 Claims, 9 Drawing Sheets

(e) "CALI"

(b) "BECA"

(d) "SASI"

(a) "SECA"

(c) "BOS"

(b) "SASI+BOS"

(a) "SECA+BECA"

WHITE LIGHT LED DEVICES WITH FLAT SPECTRA

This application is a continuation-in-part and claims the benefit of U.S. patent application Ser. No. 10/580,973, filed Apr. 2, 2007 having an international filing date of Jun. 23, 2004, and which claims the benefit of Provisional Application Ser. Nos. 60/480,975 and 60/545,445, filed Jun. 24, 2003 and Feb. 17, 2004, respectively.

BACKGROUND

The present exemplary embodiments relate to phosphor blends for the conversion of radiation emitted by a light source. They find particular application in conjunction with converting LED-generated ultraviolet (UV), violet or blue radiation into white light for general illumination purposes. It should be appreciated, however, that the invention is also applicable to the conversion of radiation from UV, violet and/or blue lasers as well as other light sources to white light.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green emission. The total of the light from the phosphor and the LED chip provides a color point with corresponding color coordinates (x and y) and correlated color temperature (CCT), and its spectral distribution provides a color rendering capability, measured by the color rendering index (CRI).

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature.

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}:Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

The blue LED-YAG phosphor device described above typically produces a white light with a general color rendering index ($R_a$) of from about 70-82 with a tunable color temperature range of from about 4500K to 8000K. Recent commercially available LEDs using a blend of YAG phosphor and a red phosphor ($CaS:Eu^{2+}$) provide color temperatures below 4500K with a fixed value of $R_a$ around 90. While such LEDs are suitable for some applications, many users desire a light source with an even higher $R_a$, one similar to that of incandescent lamps with a value of 95-100.

There are also white LEDs that utilize a UV emitting chip and a phosphor blend including red, green and blue emitting phosphors designed to convert the UV radiation to visible light. One problem with these LEDs is that their spectra generally have "peaks" and "valleys" when compared to CIE reference illuminants of the same CCT, which make them deficient in certain regions of the visible spectrum, especially between 450 and 650 nm. For color critical applications (medical, military, etc.), this is not acceptable.

The International Commission on Illumination (CIE) has developed a system of colorimetric illuminants, each of which is defined by a unique spectral power distribution (SPD). Ref. CIE Standard; CIE Colorimetric illuminants, ISO/CIE 10526-1991 (CIE S001-1986).

Other CIE documents define the choice of reference illuminants, e.g. in CRI calculations, as given in: CIE Method of Measuring and Specifying Colour Rendering Properties of Light Sources, CIE 13.3 (1995). For the purposes of this application, any further mention of a "reference illuminant" has the same meaning as in the aforementioned CIE 13.3 publication, unless specified otherwise. Thus the reference illuminants are theoretical light sources used for comparison and evaluation of real (also referred to as test) light sources of the same CCT. For CCT values less than 5000K, the SPD of the CIE reference illuminant matches that of the black body (a.k.a. Planckian) radiator. For CCT values equal to or greater than 5000K, the reference illuminant represents an idealized phase of daylight.

Whenever numbers are used in addition to the letter to specify an illuminant, they stand for the first 2 digits of the CCT. For example, D65 denotes the most widely used daylight illuminant with a CCT of 6500K. Other important daylight illuminants are D50 and D75, with CCT values of 5000K and 7500K, correspondingly.

One special CIE illuminant is illuminant E (a.k.a. Equal Energy Illuminant), the SPD of which as a function of wavelength is a horizontal straight line. Illuminant E has a fixed CCT of approximately 5450K, and has the property of $x=y=z=\frac{1}{3}$ in the 1931 CIE chromaticity diagram. Although simulation of this illuminant would be extremely difficult for any existing prior art solution, a simulator source would be very useful e.g. in building spectrometers, calorimeters and other similar devices.

On the other hand, certain other CIE illuminants (A, B, C and F) are generally simulated in a straightforward manner, by using either incandescent (A), filtered incandescent (B and C) or fluorescent (F) lamp sources.

As mentioned earlier, at low CCT values (e.g. less than 3200K), the SPD of the CIE reference illuminant is that of the Planckian radiator, and is easily simulated by incandescent light sources. It becomes however progressively more difficult to simulate the SPD of reference illuminants with real light sources at elevated CCTs—e.g. greater than 3200K, and especially equal to or greater than 5000K, when a switch is made from a Planckian spectrum to a phase of daylight in the reference illuminant. Existing simulators of such illuminants work by altering the spectra of incandescent or halogen lamps though filtration, thereby further decreasing their already low efficiency. This necessitates the use of high power light sources and heat resistant filters in order to achieve acceptable light levels.

Simulators of illuminants approximate the SPD of the illuminant at least within a certain wavelength interval e.g. at least from 450 to 650 nm (where the human eye sensitivity curve is at approximately 10% or higher level of its maximum value) more preferably at least from 400 to 700 nm (where the human eye sensitivity curve is at approximately 1% or higher level of its maximum value), and to within certain tolerance limits, e.g. +/−20%, +/−15% or +/−10%. The broader the wavelength interval and the lower the tolerance limit, the better the simulation of the reference illuminant by the actual source under consideration.

An alternative (and inherently more energy efficient) solution for light sources approximating CIE illuminants makes use of LED chips with substantially different peak wavelengths spanning the range from at least 450 to 650 nm. Although technically feasible, this is an extremely complex and expensive solution, due to the need to maintain dynamic power control over multiple wavelength channels in order to achieve and maintain the requisite SPD simulating that of a reference illuminant. In addition, mixing the light from chips with substantially different peak wavelengths is always a challenge and good color uniformity is difficult to achieve.

It would therefore be desirable to develop new and efficient light sources with a generally flat emission spectrum and conforming to within certain tolerance limits (e.g. +/−20% or better) with CIE reference illuminants e.g. of type D or with illuminant E, at least in the spectral region from 450 to 650 nm, preferably 400 to 700 nm, by using LED chips with substantially the same peak wavelength. The present invention provides new and improved phosphor blends and method of formation, which overcome the above-referenced problems and others.

BRIEF SUMMARY

In a first aspect, there is provided a lighting device for emitting white light including a light source emitting radiation with a peak at from about 350 nm to about 430 nm; and a phosphor material radiationally coupled to the light source, wherein an emission of the lighting device has an emission intensity conformance at least in the spectral region from 450 to 650 nm to within ±20% with a reference CIE illuminant.

In a second aspect, there is provided a phosphor blend for use in the above lighting device, wherein the phosphor blend comprises at least three phosphor compositions such that an emission of the lighting device has an emission intensity conformance to within ±20% with a reference CIE illuminant at least in the spectral region from 450 to 650 nm.

In a third aspect, there is provided a method producing the above lighting device, comprising providing a light source emitting radiation with a peak at from about 350 nm to about 430 nm; and a phosphor material radiationally coupled to the light source, such that an emission of the lighting device has an emission intensity conformance at least in the spectral region from 450 to 650 nm to within ±20% with a reference CIE illuminant.

In a fourth aspect, there is provided a lighting device for emitting white light comprising: a light source emitting radiation having a peak emission in the range from about 250 nm to about 410 nm; and a phosphor material radiationally coupled to the light source, wherein an emission conformance within an intensity range of ±15% with a reference CIE illuminant at least in the spectral region from 400 to 700 nm.

DETAILED DESCRIPTION OF THE PREFERRED EMBODIMENTS

Figure 2:
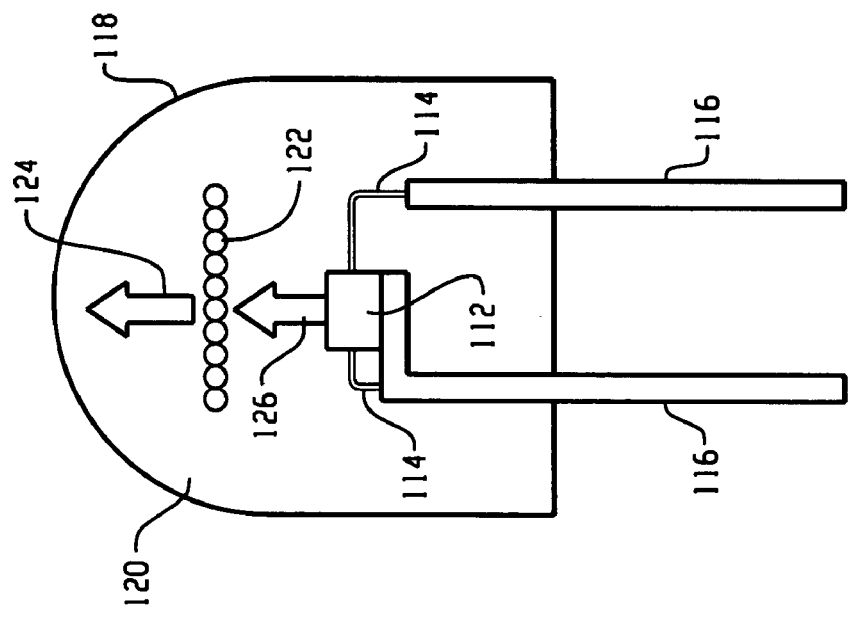
FIG. 2 is a schematic cross-sectional view of an illumination system in accordance with a second embodiment of the present invention.

Novel phosphor blends are presented herein as well as their use in LED and other light sources. The color of the generated visible light is dependent on the particular components of the phosphor material. As used herein, the terms "phosphor" and "phosphor material" may be used to denote both a single phosphor as well as a blend of two or more phosphors.

It was determined that a lighting device that produces an SPD simulating that of a CIE reference or standard illuminant to within certain tolerance limits and inside at least a certain wavelength interval would be useful to impart desirable qualities to such light sources. Exemplary light sources for use in such devices include semiconductor light sources such as light emitting diodes, although other light sources are contemplated.

Therefore, in one embodiment of the invention, a luminescent phosphor conversion material coated LED chip is disclosed for providing white light. The phosphor material may be a blend from at least three individual phosphor compositions that converts radiation at a specified wavelength, for example radiation from about 250 to 450 nm as emitted by a UV to visible LED chips with substantially the same peak wavelength, into a different wavelength visible light. The visible light provided by the phosphor material (along with any residual bleed from the LED chips) SPD simulates that of a CIE reference or standard illuminant to within certain tolerance limits and inside at least in the spectral region from 450 to 650 nm.

The present invention is related to phosphor blends excitable under near-UV to blue LED radiation, with a resultant emission spectrum approaching the full spectrum of a reference CIE illuminants between about 400 and 700 nm, particularly between 450 nm and 650 nm. The emission spectrum of the present phosphor blend preferably corresponds to within about +/−20%, more preferably, +/−15%, and most preferably +/−10% of the SPD of the reference illuminant. A preferred reference illuminant is a daylight illuminant D in the range 5000-7500 K, and a particularly preferred reference illuminant is D65 (6500K). In one embodiment, the phosphor blend includes a minimum of three spectral constituents (blue, green and red), with a peak wavelength of about 460, 560, and 670 nm, and spectral widths of about 150, 100, and 150 nm, correspondingly. A non-limiting example of the blue constituent is an alkaline earth halophosphate doped with at least $Eu^{2+}$, e.g. $(Mg,Ca,Sr,Ba,Zn)_5(PO_4)_3(F,Cl,Br):Eu^{2+}$. A non-limiting example of the green constituent is an alkaline earth silicate doped with at least $Eu^{2+}$, e.g. $(Mg,Ca,Sr,Ba,Zn)_2 Si_{1-x}O_{4-2x}:Eu^{2+}$ (wherein $0 \leq x \leq 0.2$). A non-limiting example of the red constituent is an alkaline earth nitride doped with at least $Eu^{2+}$, e.g. $(Mg,Ca,Sr)AlSiN_3:Eu^{2+}$ and its compositional modifications known in the art. Other combinations are contemplated as falling within the invention.

The phosphor emission bandwidths needed for implementation are comparable to those of currently known phosphors used in nearly full-spectrum fluorescent lamps. In accordance with the present invention, the emission spectra of the phosphors can be broadened by introducing additional host lattice elements (e.g., introduction of Ba or Ca into Sr-based lattices of the example phosphor systems given above). Such tailoring enables the phosphor compositions to be excitable by UV/visible radiation. Alternatively, broadening of the emission spectra may be achieved by physically blending chemically similar phosphors with different compositions, e.g. $Sr_5(PO_4)_3Cl:Eu^{2+}$ with $(Ca,Ba)_5(PO_4)_3Cl:Eu^{2+}$, or $(Ba,Sr)_2Si_{1-x}O_{4-2x}:Eu^{2+}$ with $(Sr,Ca)_2Si_{1-x}O_{4-2x}:Eu^{2+}$, etc. Advantageously, lamps obtained by use of the present invention (especially when the excitation light source is an LED) will be free of "spikes" e.g. from Hg lines present in the spectra of discharge lamps.

Figure 1:
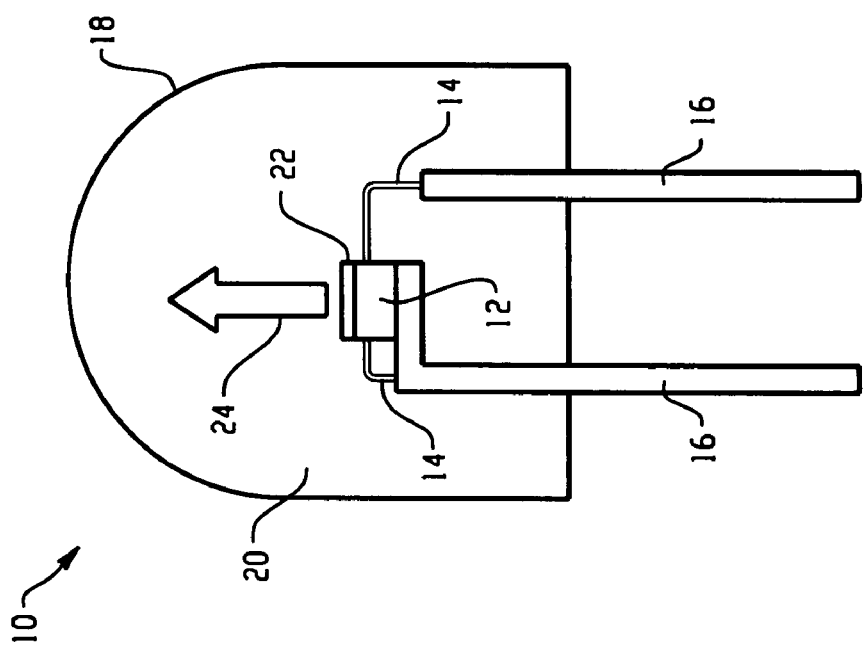
FIG. 1 is a schematic cross-sectional view of an illumination system in accordance with one embodiment of the present invention.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self-supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred peak emission of the LED chip in the present invention will depend on the identity of the phosphors in the disclosed embodiments and may range from, e.g., 250-430 nm. In one preferred embodiment, however, the emission of the LED will be in the near UV to deep blue region and have a peak wavelength in the range from about 350 to about 430 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 430 nm. Advantageously, the peak wavelength range of the LED chips selected for any particular embodiment will be substantially the same (e.g. spanning an interval of no more than 10 nm, preferably no more than 5 nm). Thus, operation of the lighting device will be simplified and its color uniformity will be improved.

Preferably, the LED may contain at least one semiconductor layer comprising GaN, AlN or SiC. For example, the LED may comprise a nitride compound semiconductor represented by the formula $In_jGa_kAl_lN$ (where $0 \leq j$; $0 \leq k$; $0 \leq l$ and $j+k+l=1$) having a peak emission wavelength greater than about 250 nm and less than about 430 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin, silicone, or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self-supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so radiation from one is transmitted to the other.

This phosphor material 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor material 22 and LED 12. Thus, the phosphor material 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor material may be from about 1 to about 10 microns.

FIG. 2 illustrates a second preferred structure of the system according to the preferred aspect of the present invention. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer molding.

Figure 3:
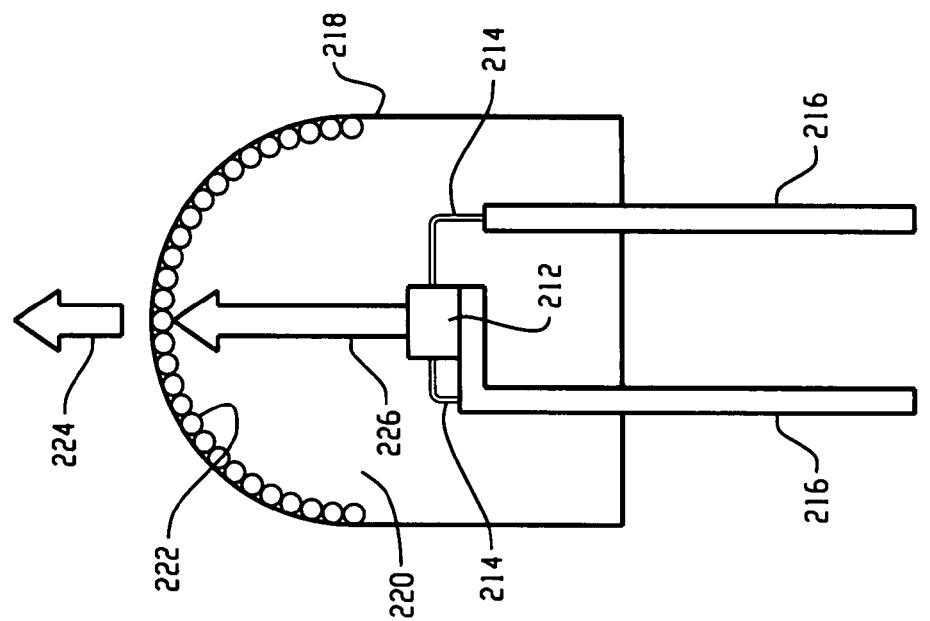
FIG. 3 is a schematic cross-sectional view of an illumination system in accordance with a third embodiment of the present invention.
Figure 5:
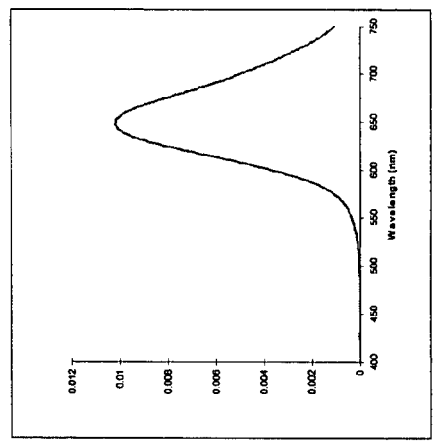
FIGS. 5a-5e are experimental plaque emission spectra of various individual phosphors suitable for use in the present embodiments.
Figure 5:
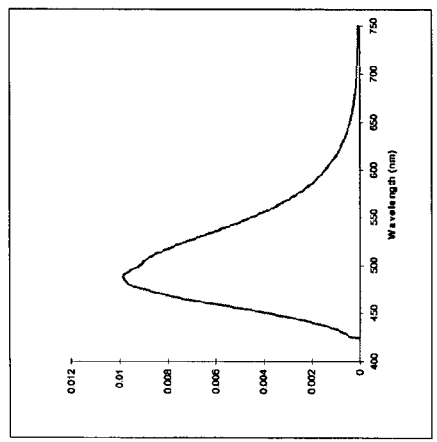
Figure 5:
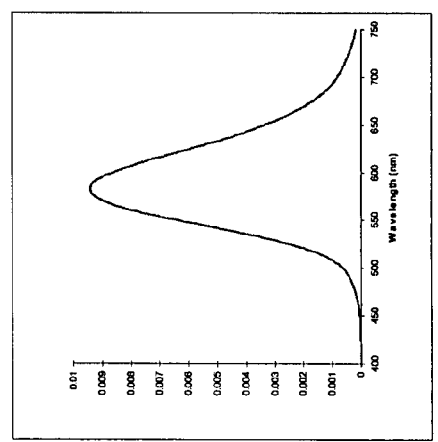
Figure 5:
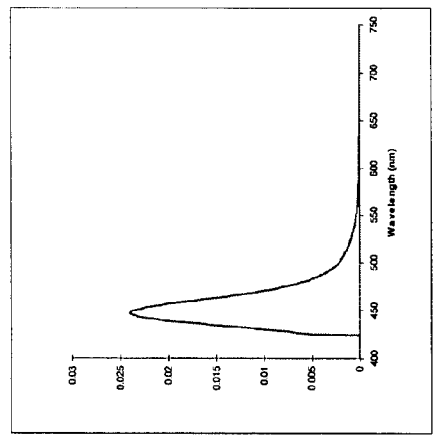
Figure 5:
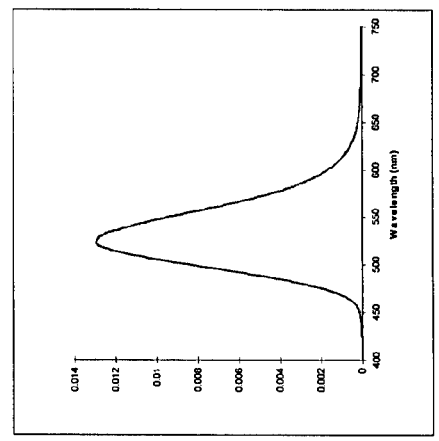

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

Figure 4:
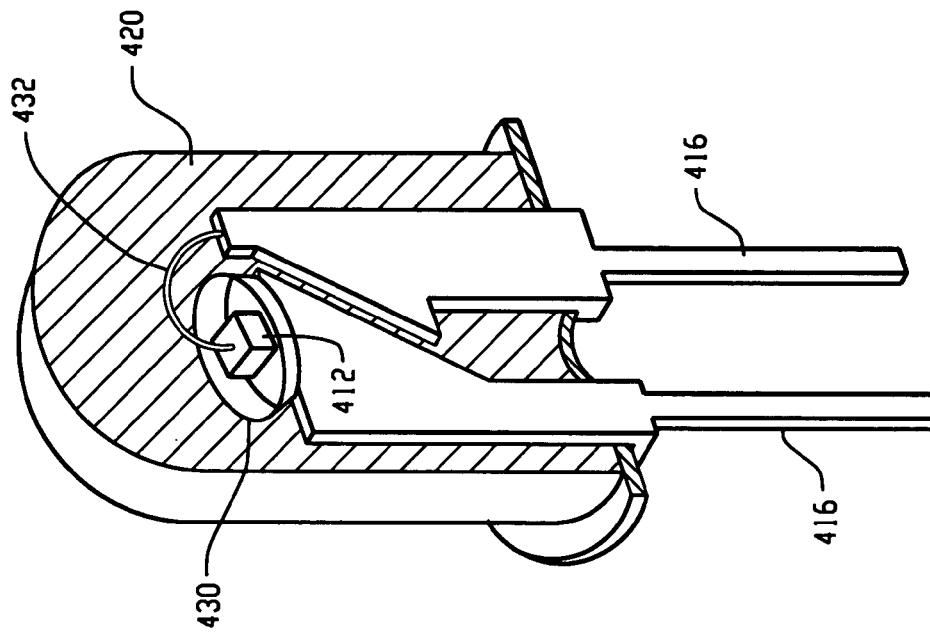
FIG. 4 is a cutaway side perspective view of an illumination system in accordance with a fourth embodiment of the present invention.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a phosphor blend, which may be used in the phosphor material 22 in the above described LED light, wherein the phosphor material is a blend of at least two distinct phosphor compositions. The phosphor compositions in the blend are chosen such that when the phosphor material is stimulated by an emission from the LED chip, the emission of the phosphor blend, along with any residual bleed through emission from the LED chip, has an emission intensity conformance within ±20% with a reference CIE illuminant having a similar CCT as the lighting device in the spectral region from 400 to 700, and more particularly 450 to 650 nm. One particularly important CIE standard illuminant is known as D65, and is the most commonly used daylight illuminant representing noon daylight (approximately 6500 K). In practice, many of the embodiments contemplated herein are specifically appropriate for comparison with this D65 illuminant, although the device can be designed to simulate other CIE illuminants instead, such as D50, D55, D75, E, etc.

By this, it is meant that the emission from the lighting device simulates the emission from a CIE illuminant having the same color temperature as the lighting device in the spectral region at least from 450 nm to 650 nm, such that the emission intensity of the lighting device is in the range of from 80% to 120%, and more preferably in the range of from 90% to 110%, of the emission intensity of the reference illuminant within that range. More preferably, the lighting device has an emission that satisfies the former condition for emission intensity at least in the spectral range of 400 to 700. Even more preferably, the lighting device has an emission that satisfies the latter condition for emission intensity at least in the spectral range of 400 to 700 .

The specific amounts of the individual phosphors used in the phosphor material 22 will depend upon the desired color temperature. That is, by varying the identities and amounts of the phosphors in the blend, the correlated color temperature (CCT) of the device can be controlled.

The phosphors in the blend are chosen such that their combined emission, when combined with residual bleed (if any) from the LED chip, produces an emission having the above characteristics. In one embodiment, the phosphors are broadband emitting phosphors having a full width at half-maximum (FWHM) greater than 100 nm. Such phosphors include, but are not limited to $(Mg,Ca,Sr,Ba,Zn)_5(PO_4)_3(Cl,F):Eu^{2+}$; $(Mg,Ca,Sr,Ba,Zn)_2SiO_4:Eu^{2+}$; $CaAlSiN_3:Eu^{2+}$;and their compositional modifications known in the art, e.g. as described in commonly owned co-pending U.S. patent application Ser. No. 11/216,566, filed on Aug. 31, 2005 and Ser. No. 11/285,024, filed on Nov. 22, 2005, the disclosures of which are incorporated herein by reference in their entirety.

In addition, or alternatively, blends of binary phosphors may be used. Thus, for example, a blend of $Sr_5(PO_4)_3Cl:Eu^{2+}$ and $(Ba,Ca)_5(PO_4)_3Cl:Eu^{2+}$ and/or a blend of $(Sr,Ba)_2SiO_4:Eu^{2+}$ and $(Ca,Sr)_2SiO_4:Eu^{2+}$ can be used instead of the $(Ca,Sr,Ba)_5(PO_4)_3Cl:Eu^{2+}$ and $(Ca,Sr,Ba)_2SiO_4:Eu^{2+}$ phosphors containing all 3 alkaline earths, correspondingly. The amount of activator doping in each phosphor will generally vary from 0.001 to 50 mole percent, preferably from about 0.01 to 30%.

As a result, overall emission spectra with very flat emission (conformation to +/−20% or better to the CIE illuminant in the region from 450 to 650 nm, or more broadly from 400 to 700 nm) can be obtained for the white LEDs using such blends. Advantageously, the method of mixing 2 or 3 binary phosphor blends allows for an easier color point targeting, as in the linear fluorescent lamp industry. Alternatively, color corrections can be made by mixing the phosphors independently and correcting the spectra of the blends by inspection in a few iterations. Another important feature of the present embodiments is that these LEDs tend to have very high general CRI (greater than 90, even equal to or greater than 95), by virtue of their spectra approaching closely those of the corresponding reference illuminants.

The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%. In a preferred embodiment, each of the individual phosphors in the blend will have a spectral weight ranging from about 5 to 75%.

It will be appreciated by a person skilled in the art that other phosphors with sufficiently similar emission spectra may be used instead of any of the preceding suitable examples, even though the chemical formulations of such substitutes may be significantly different from the ones listed in the aforementioned examples.

Additionally, part of the LED light may be allowed to bleed through and contribute to the light spectrum of the device if necessary for achieving full spectrum appearance. The amount of LED bleed can be adjusted by changing the optical density of the phosphor layer, as routinely done for industrial blue chip based white LEDs. Alternatively, it may be adjusted by using a suitable filter or a pigment, as described further below.

It may be desirable to add pigments or filters to the phosphor material. When the LED is a UV emitting LED, the phosphor layer 22 may also comprise from 0 up to about 5% by weight (based on the total weight of the phosphors) of a pigment or other UV absorbent material capable of absorbing or reflecting UV radiation having a wavelength between 250 nm and 450 nm.

Suitable pigments or filters include any of those known in the art that are capable of absorbing radiation generated between 250 nm and 550 nm. Such pigments include, for example, nickel titanate or praseodymium zirconate. The pigment is used in an amount effective to filter 10% to 100% of the radiation generated in any of the 250 nm to 450 nm range.

By choosing appropriate phosphors and assigning spectral weights for each, one can create spectral blends to cover the relevant portions of color space, especially for white lamps. Specific examples of this are shown below. For various desired CCT's, CRI's and color points, one can determine the appropriate amounts of each phosphor to include in the blend. Thus, one can customize phosphor blends to produce almost any CCT or color point, with corresponding high CRI. The examples shown are for representative spectra of each phosphor. Of course, the color of each phosphor will be dependent upon its exact composition (e.g. relative amounts of Ba, Ca, Sr, Mg, and Zn as well as Eu in $(Mg,Ca,Sr,Ba,Zn)_2SiO_4:Eu^{2+}$ phosphor), which can change the color of the phosphor to a degree where it may have to be renamed, e.g. green instead of blue. Determining the changes in the spectral weight to produce the same or similar characteristic lighting device necessitated by such variations is trivial and can be accomplished by one skilled in the art using various methodologies, such as design of experiment (DOE) or other strategies.

By use of the present invention, and particularly the phosphor blends described in embodiment two, lamps can be provided that simulate the SPD of CIE reference or standard illuminants to within certain tolerance limits and at least in the spectral interval from 450 to 650 nm, and more preferably in the interval of from 400 to 700.

EXAMPLES

Light sources using phosphor blends according to the above embodiments may be produced. Various exemplary prophetic trials, blend spectra and device spectra are presented. The phosphors used in these trials and experimental data were $(Sr,Ca,Ba)_5(PO_4)_3Cl:Eu^{2+}$ ("SECA"); $(Ba,Ca)_5(PO_4)_3Cl:Eu^{2+}$ ("BECA"); $(Ba_{0.65}Sr_{0.20}Ca_{0.10}Eu_{0.05})_2SiO_4$ ("BOS"), $Sr_{1.66}Ca_{0.30}Eu_{0.04}Si_{0.96}O_{3.92}$ ("SASI") and $Ca_{0.88}Li_{0.1}Eu_{0.02}Si_{1.1}Al_{0.9}N_3$ ("CALI").

A method of making a phosphor blend and a lighting device comprising said blend such that an emission of the lighting device has an emission intensity conformance at least in a defined spectral region to within ±20% or better to a reference CIE illuminant is detailed further below. This method can be used whenever more than 3 phosphors are needed to achieve the requisite conformance outlined earlier. The method consists in pre-blending phosphors with similar peak wavelengths, preferably no more than 2 at a time, in order to obtain a blue, a green and a red emitting phosphor material. Optionally, one or two of these phosphor materials may be individual phosphor compositions. Then, the blue, green and red phosphor materials are blended to a requisite pair of color coordinates for their combined plaque emission spectra (e.g. x and y in the 1931 CIE chromaticity diagram). Since any 3 phosphor materials of different color can be blended to a pair of color coordinates in only one proportion (unlike 4 or more materials which can be blended independently to the same pair of color coordinates in an infinite number of ways), a blend with a predetermined color point can be thus obtained. Typically, the target color point would be slightly above the Planckian (or black body) locus, e.g. between 0.005 and 0.020 units in the 1931 CIE diagram) and near the target CCT (e.g. 6500K), to allow for some displacement of the color point due to residual LED chip bleed.

By providing enough individual phosphor compositions to achieve sufficient spectral coverage by the final three phosphor materials to be blended together, the required level of conformance to a CIE reference illuminant (or a standard CIE illuminant) can be achieved.

Model Solution

Figure 12:
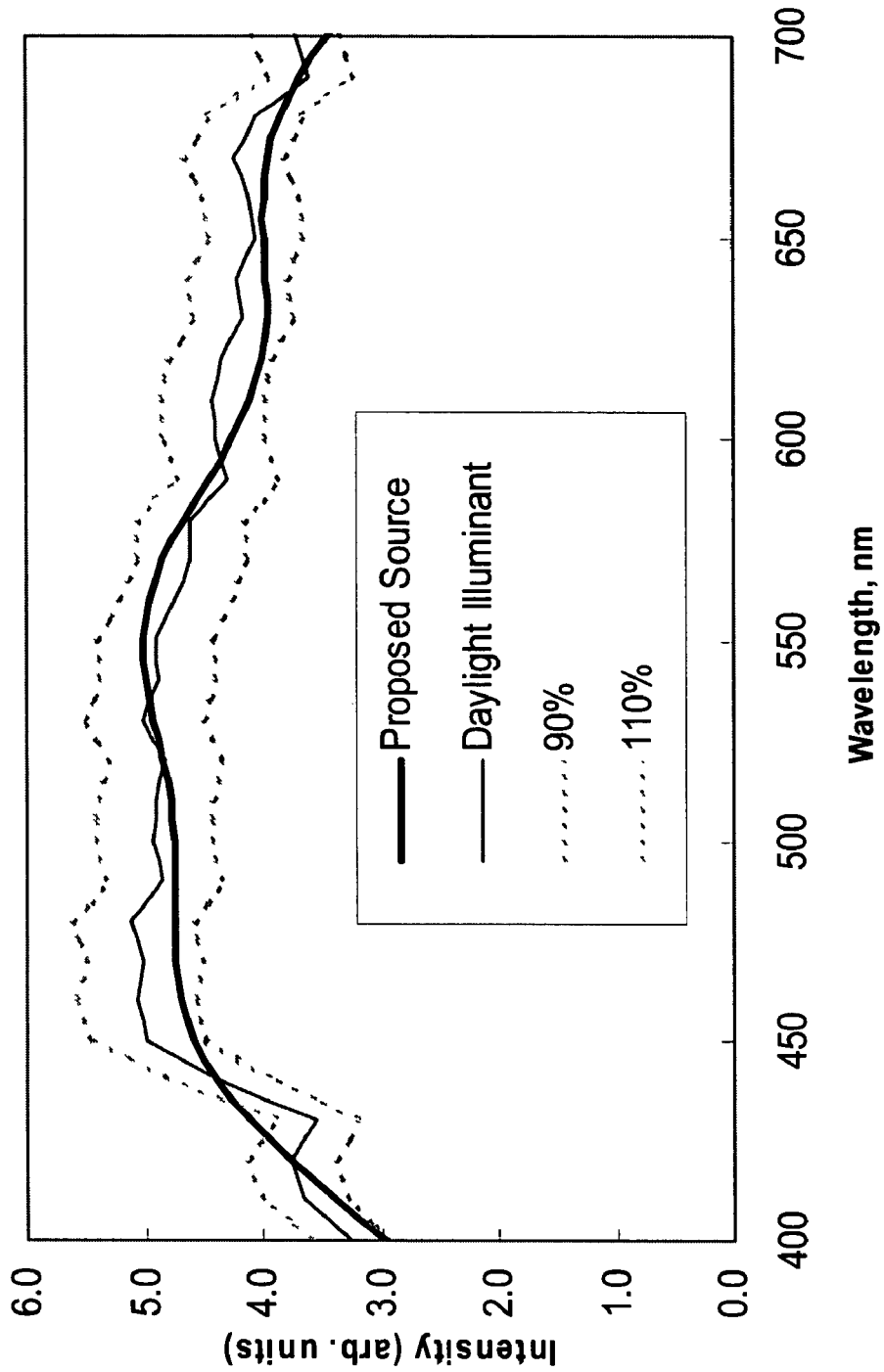
FIG. 12 is a calculated emission spectrum of a three-phosphor model blend compared to the SPD of a daylight reference illuminant.

The following solution shows how such blending of individual phosphors can be calculated to provide appropriate blends. The light source is assumed as being a UV LED chip emitting below 380 nm (i.e. with no appreciable contribution to the overall spectrum in the visible region), and it is contemplated using broadband down converting phosphors to generate the full spectrum. A model solution, based on three Gaussian spectra of model blue, green and red phosphors having the defined spectral characteristics, is shown in Table 1 below. This solution was computed using software currently available from NIST (Color Rendering and Luminous Efficacy of White LED Spectra, Proc., Y. Ohno, SPIE Fourth International Conference on Solid State lighting, Denver, Colo., Aug. 2004, 5530, 88-98 (2004)). FIG. 12 shows 99.9% compliance (as determined by integration of the spectrum from 400 to 700nm) to within the +/−10% limits of the corresponding reference illuminant. Clearly, a 100% compliance would be expected with slightly higher tolerance limits (e.g. +/−15%) in this case.

TABLE 1

|  | Blue | Green | Red |
|---|---|---|---|
| Peak Wavelength, nm | 458 | 560 | 670 |
| Spectral Width, nm | 150 | 100 | 150 |
| Peak Intensity Ratio | 0.40 | 0.26 | 0.34 |
| Lumen Contribution, % | 32 | 44 | 24 |

Figure 11:
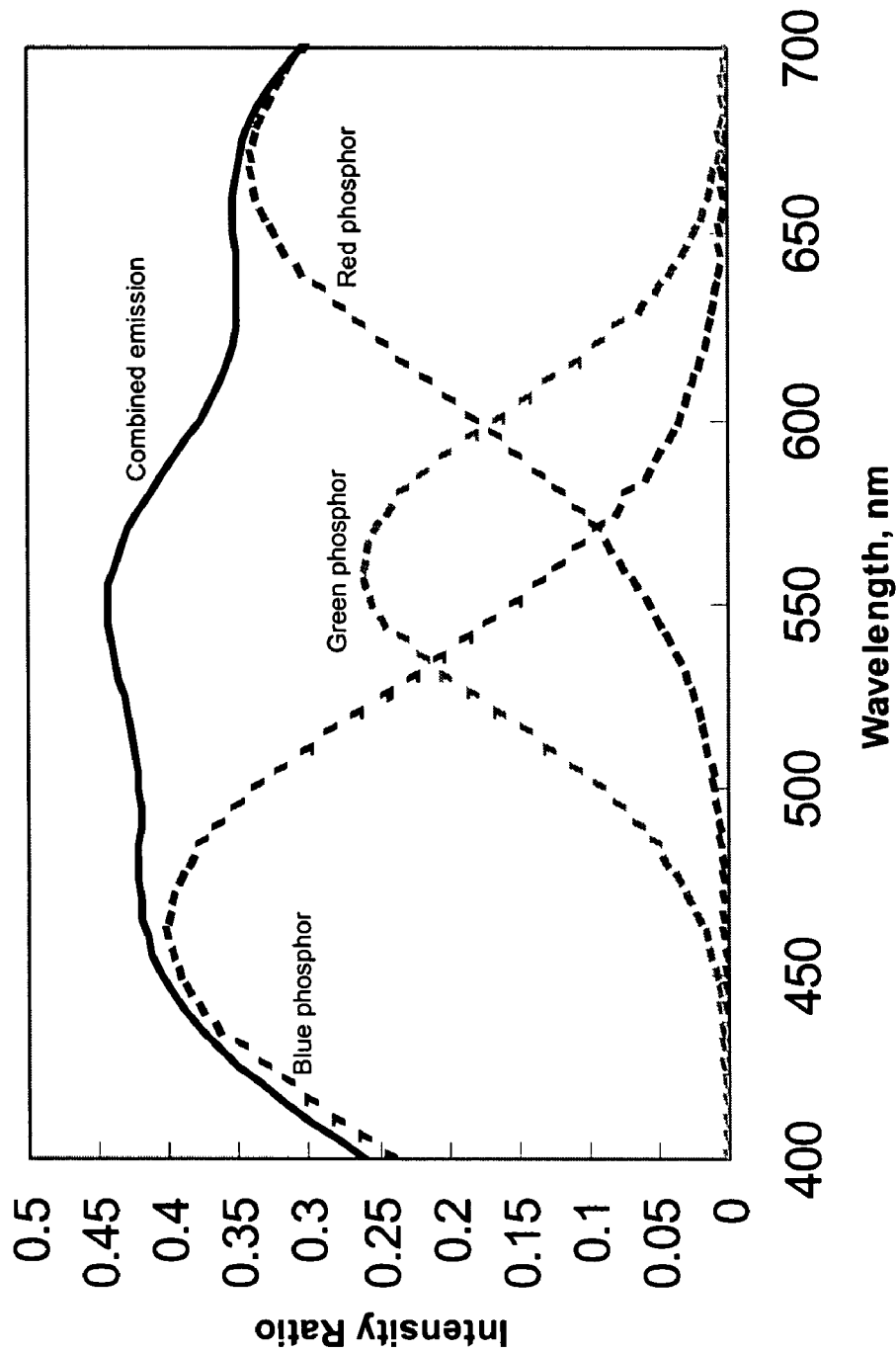
FIG. 11 is the calculated emission spectrum of a model device demonstrating a model phosphor blend.

The calculated emission spectra of the model is shown in FIG. 11, and shows the combined emission of the device as well as the individual emissions from the three phosphors.

Prophetic Example

A detailed prophetic trial is demonstrated below using a total of 5 starting phosphor compounds. For practical reasons, it is preferable that the total number of individual phosphor compounds used in this method does not exceed 5, although there is no theoretical limit to that number.

Figure 6:
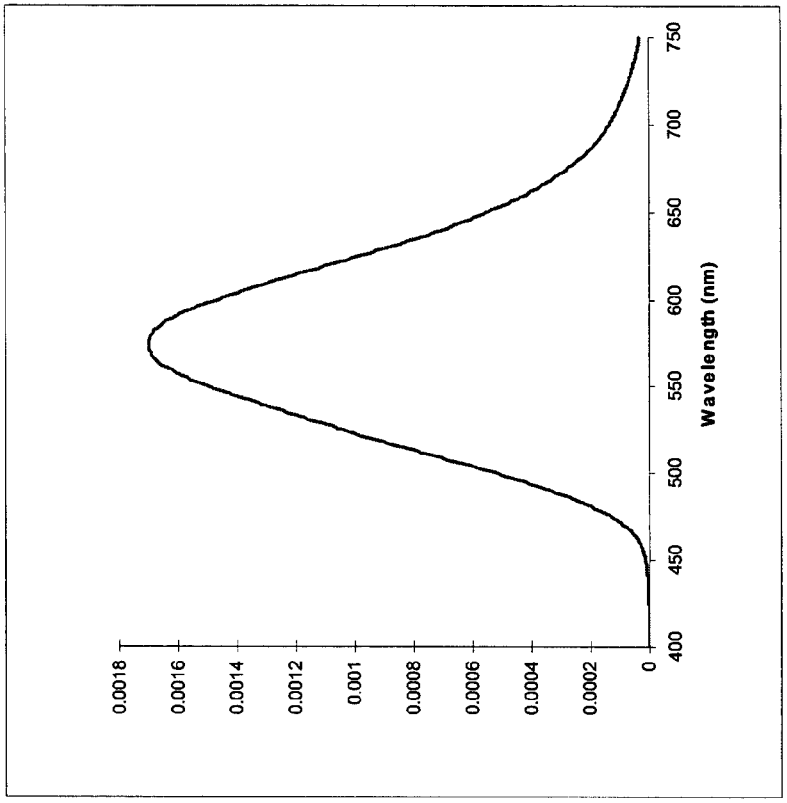
FIGS. 6a-6b are the simulated emission spectra of two component phosphor blends suitable for use in the present embodiments.
Figure 6:
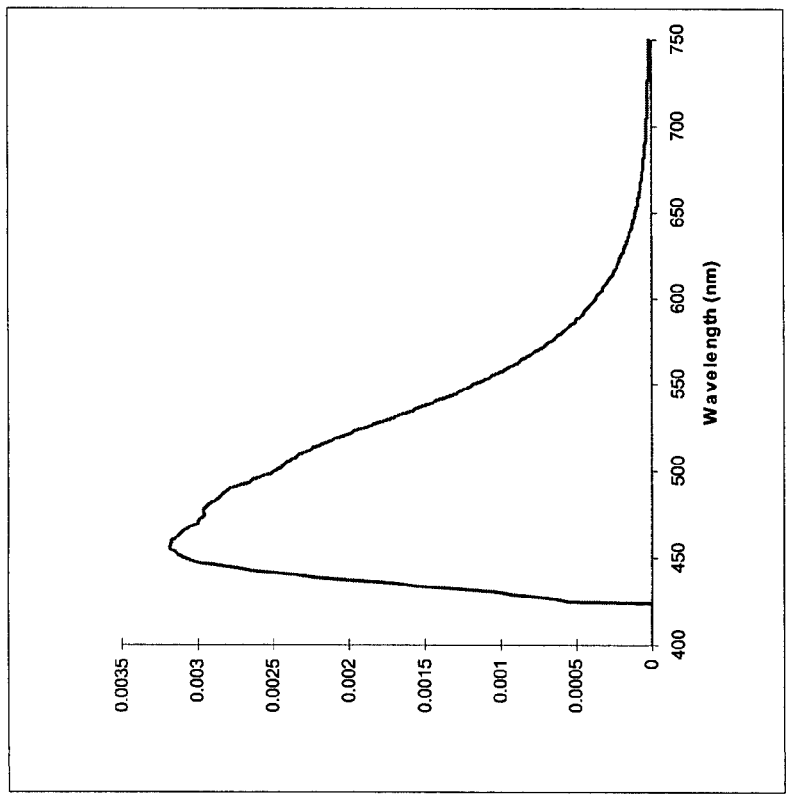
Figure 8:
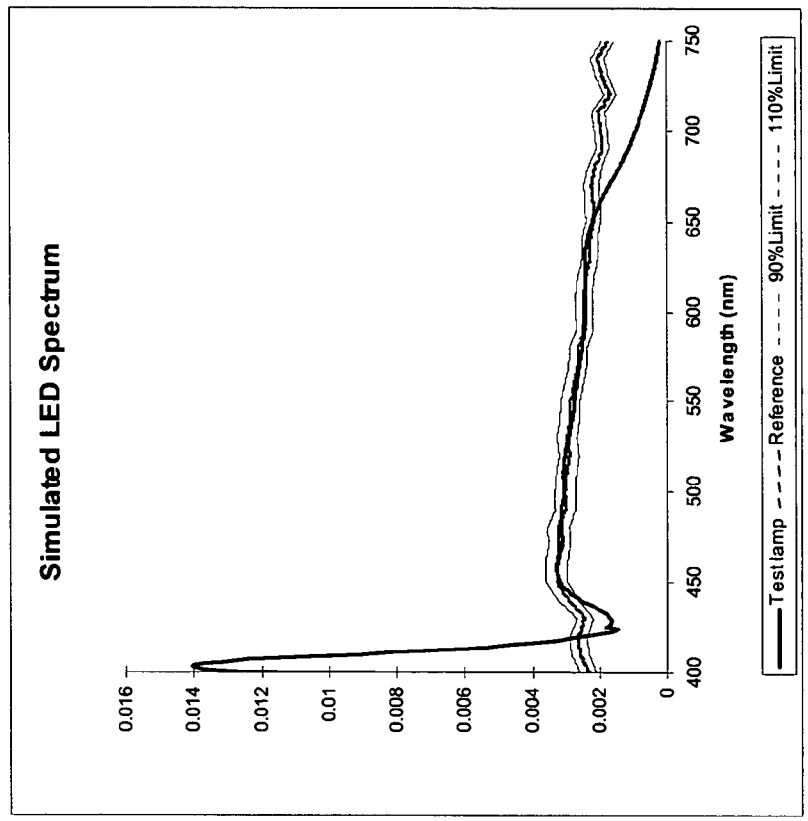
FIG. 8 is the simulated emission spectrum of a five-phosphor blend with LED bleed compared to the SPD of the CIE D65 reference illuminant.
Figure 7:
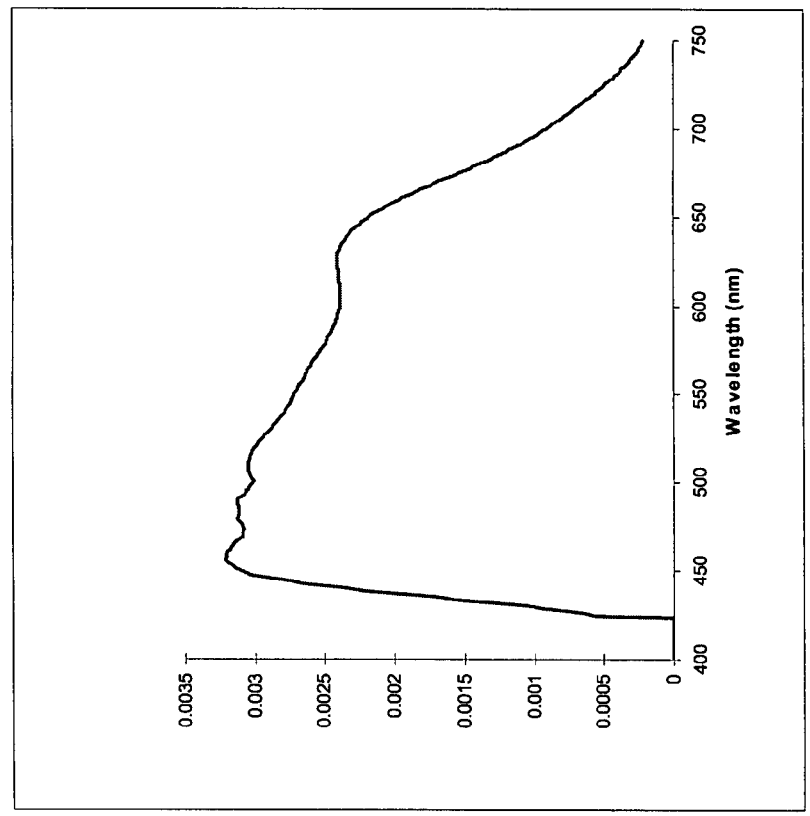
FIG. 7 is the simulated emission spectrum of a five-phosphor blend according to one embodiment of the invention.

FIGS. 5a to 5e show the simulated emission spectra of each of these phosphors individually when excited by a 405 nm emission. FIGS. 6a to 6b show the simulated emission spectra of a blend of SECA and BECA (6a) and SASI and BOS (6b). FIG. 7 shows the simulated emission spectrum of a blend of all five of the above phosphors. FIG. 8 shows the simulated emission spectrum of a blend of all five of the above phosphors together with LED bleed from the 405 nm peak emission chip compared to the D65 reference illuminant. As can be seen, the simulated lighting device has an emission intensity within 90% to 110% of the emission intensity of the reference illuminant from at least 450 nm to 650 nm.

Table 2 presents a summary of the data from each of steps of the method detailed above.

TABLE 2

| Item | Phosphor(s) | Peak | FWHM | CIE x | CIE y |
|---|---|---|---|---|---|
| a | SECA | 448 | 35 | 0.15 | 0.06 |
| b | BECA | 488 | 91 | 0.21 | 0.38 |
| c | BOS | 523 | 70 | 0.26 | 0.62 |
| d | SASI | 582 | 95 | 0.50 | 0.49 |
| e | CALI | 647 | 89 | 0.65 | 0.34 |
| f | SECA + BECA | 456 | 101 | 0.19 | 0.26 |
| g | SASI + BOS | 575 | 115 | 0.45 | 0.51 |
| h | All (e + f + g) | 459 | 238 | 0.32 | 0.35 |
| l | Simulated LED spectrum | 403 | 17 | 0.31 | 0.33 |

Figure 9:
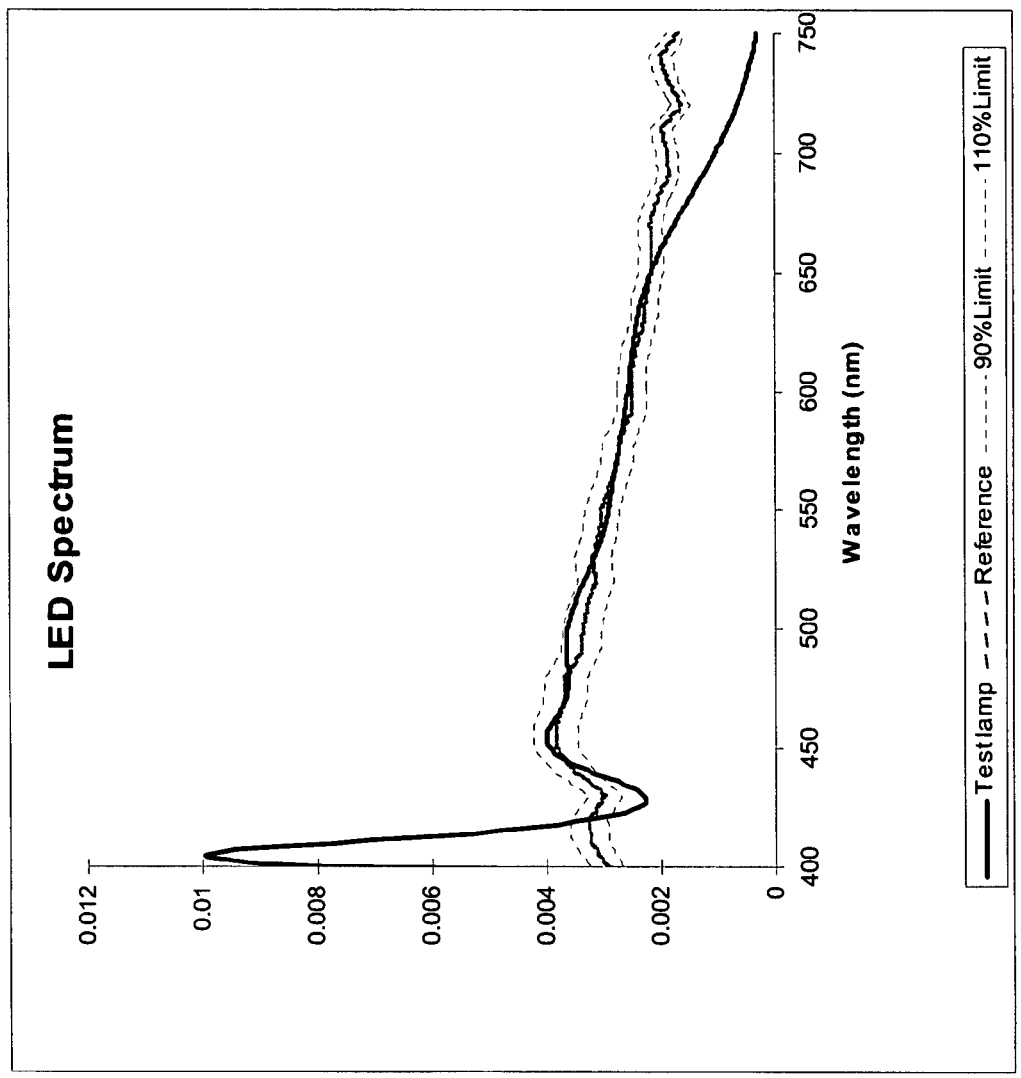
FIG. 9 is the actual emission spectrum of a five-phosphor blend with LED bleed compared to the SPD of the CIE D75 reference illuminant.

FIG. 9 shows the emission spectra from an actual experimental lighting device using a blend of the same five phosphors and an LED chip having a peak emission near 405 nm compared to the SPD of the D75 illuminant. As can be seen, the experimental spectrum has an emission intensity within 90% to 110% of the SPD of the D75 reference illuminant, at least from 445 nm to 665 nm. This device has CIE chromaticity coordinates of x=0.299, y=0.316 and a $R_a$ of 98.2.

Figure 10:
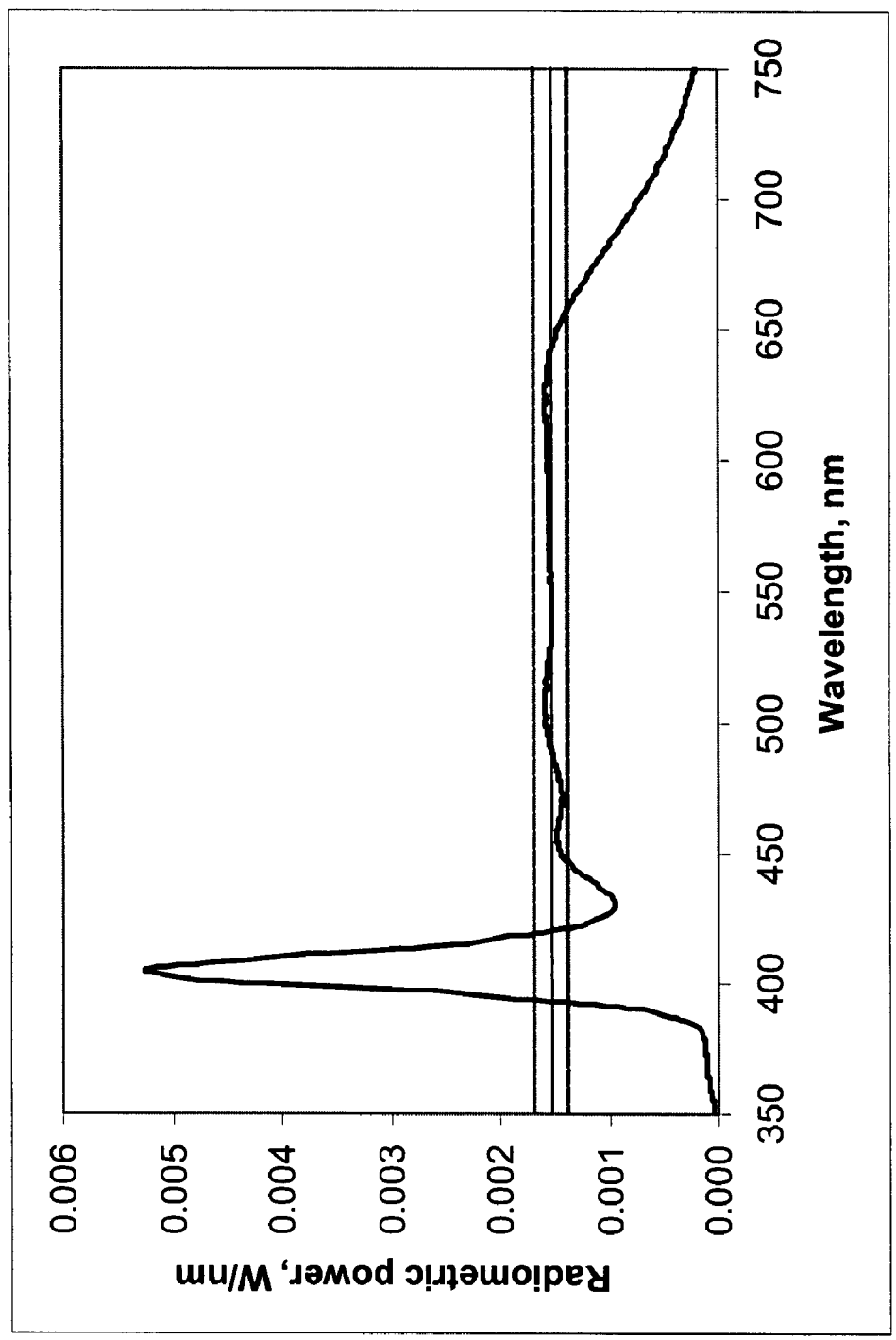
FIG. 10 is the actual emission spectrum of a lighting device using a five-phosphor blend, compared to the SPD of the CIE illuminant E.

FIG. 10 shows the emission spectrum from an actual experimental lighting device using a blend of the same five phosphors and an LED chip having a peak emission near 405 nm compared to the SPD of the CIE illuminant E (which is, as pointed out earlier, a horizontal straight line). As can be seen, the experimental spectrum has an emission intensity within 90% to 110% of the SPD of that illuminant, at least from 450 nm to 655 nm. This device has CIE chromaticity coordinates of x=0.339, y=0.344 and a $R_a$ of 97.4.

Thus, the use of the above described phosphor blends and/or general method allows the production of light sources with extremely high CRI values approaching those achieved by reference illuminants throughout the useful CCT range, thereby allowing the replacement of such illuminants with LEDs in almost any application.

The invention has been described with reference to the preferred embodiment. Obviously, modifications and alterations will occur to others upon reading and understanding the preceding, detailed description. It is intended that the invention be construed as including all such modifications and alterations, insofar as they come within the scope of the appended claims or the equivalents thereof.

What is claimed is

1. A lighting device for emitting white light comprising:
    a light source emitting radiation having a peak emission in the range from about 350 nm to about 430 nm; and
    a phosphor material radiationally coupled to the light source, wherein an emission of the lighting device has an emission intensity conformance within ±20% with a reference CIE illuminant at least in the spectral interval from 450 to 650 nm.

2. The lighting device of claim 1, wherein the light source comprises one of an LED and an organic emissive structure.

3. The lighting device of claim 2, further comprising an encapsulant surrounding the light source.

4. The lighting device of claim 3, wherein the phosphor material is dispersed in the encapsulant.

5. The lighting device of claim 1, further comprising a reflector cup.

6. The lighting device of claim 1, further including a pigment, filter or other absorber capable of absorbing radiation generated between 250 nm and 450 nm.

7. The lighting device of claim 1, wherein said phosphor material comprises a blend of no more than 5 phosphor compounds.

8. The lighting device of claim 1, wherein said lighting device has an emission intensity conformance within ±10% with a reference CIE illuminant at least in the spectral interval from 450 to 650 nm.

9. The lighting device of claim 1, wherein said lighting device has an emission intensity conformance within ±20% with a reference CIE illuminant at least in the spectral interval from 400 to 700 nm.

10. The lighting device of claim 1, wherein said reference illuminant is D65.

11. The lighting device of claim 1, further including scattering particles.

12. The lighting device of claim 1, wherein said lighting device has a general CRI ($R_a$) equal to or greater than 95.

13. A phosphor blend for use in the lighting device of claim 1, wherein the phosphor blend comprises at least three phosphor compositions.

14. A lighting device for emitting white light comprising:
    a light source emitting radiation having a peak emission in the range from about 350 nm to about 430 nm; and a phosphor material radiationally coupled to the light source, wherein an emission of the lighting device has an emission intensity conformance within ±10% with CIE illuminant E at least in the spectral region from 450 to 650 nm.

15. A lighting device for emitting white light comprising:
a light source emitting radiation having a peak emission in the range from about 250 nm to about 410 nm; and
a phosphor material radiationally coupled to the light source, wherein an emission of the lighting device has an emission conformance within an intensity range of ±15% with a reference CIE illuminant at least in the spectral interval from 400 to 700 nm.

16. The lighting device of claim 15, wherein said lighting device has an emission intensity conformance at least 99% and within an intensity range of ±10% with a reference CIE illuminant at least in the spectral interval from 400 to 700 nm.

* * * * *